(12) United States Patent
Boehm

(10) Patent No.: US 8,543,953 B2
(45) Date of Patent: Sep. 24, 2013

(54) AUTOMATED STIMULUS STEERING DURING SIMULATION OF AN INTEGRATED CIRCUIT DESIGN

(75) Inventor: Fritz A. Boehm, Dripping Springs, TX (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 13/343,103

(22) Filed: Jan. 4, 2012

(65) Prior Publication Data
US 2013/0174108 A1    Jul. 4, 2013

(51) Int. Cl.
*G06F 17/50*    (2006.01)

(52) U.S. Cl.
CPC ........ *G06F 17/5022* (2013.01); *G06F 17/5081* (2013.01)
USPC .............. 716/111; 716/107; 716/136; 703/16

(58) Field of Classification Search
CPC ........................ G06F 17/5022; G06F 17/5081
USPC ........................... 716/111, 107, 136; 703/16
See application file for complete search history.

(56) References Cited

U.S. PATENT DOCUMENTS

| | | | |
|---|---|---|---|
| 5,051,938 A * | 9/1991 | Hyduke ........................... | 703/15 |
| 5,177,440 A * | 1/1993 | Walker et al. .................. | 714/736 |
| 5,371,851 A * | 12/1994 | Pieper et al. ................... | 345/501 |
| 5,513,339 A * | 4/1996 | Agrawal et al. ................ | 703/15 |
| 5,650,938 A | 7/1997 | Bootehsaz et al. | |
| 5,684,946 A * | 11/1997 | Ellis et al. ...................... | 714/33 |
| 5,905,883 A * | 5/1999 | Kasuya ........................... | 703/17 |
| 6,141,630 A * | 10/2000 | McNamara et al. ............ | 703/14 |
| 6,173,243 B1 * | 1/2001 | Lowe et al. ..................... | 703/14 |
| 6,466,898 B1 * | 10/2002 | Chan .............................. | 703/17 |
| 6,530,054 B2 | 3/2003 | Hollander | |
| 6,609,230 B1 * | 8/2003 | Li .................................. | 716/106 |
| 6,675,310 B1 | 1/2004 | Bloom et al. | |
| 6,678,643 B1 | 1/2004 | Turnquist | |
| 6,718,498 B2 * | 4/2004 | Imark et al. ................... | 714/741 |
| 6,742,166 B2 | 5/2004 | Foster et al. | |
| 6,975,976 B1 * | 12/2005 | Casavant et al. .............. | 703/14 |
| 7,080,365 B2 * | 7/2006 | Broughton et al. ........... | 717/146 |
| 7,086,017 B1 | 8/2006 | Bloom | |
| 7,089,135 B2 | 8/2006 | Rajsuman et al. | |
| 7,089,517 B2 * | 8/2006 | Yamoto et al. ................ | 716/108 |

(Continued)

FOREIGN PATENT DOCUMENTS

| | | | |
|---|---|---|---|
| JP | 2001331544 A | * | 11/2001 |
| JP | 2011043978 A | * | 3/2011 |

OTHER PUBLICATIONS

U.S. Appl. No. 13/223,430, filed Sep. 1, 2011, inventor Boehm.

(Continued)

*Primary Examiner* — Phallaka Kik
(74) *Attorney, Agent, or Firm* — Meyertons, Hood, Kivlin, Kowert & Goetzel P.C.; Stephen J. Curran

(57) ABSTRACT

A method is contemplated in which the stimulus to an IC design simulation may be automatically manipulated or steered so that the test environment is altered during subsequent simulations of the IC design based upon the simulation results and/or configuration settings of previous simulations of the IC design. More particularly, a stimulation steering tool may analyze the simulation results and/or the test environment, and manipulate the test environment, which may include the test generator output, and the test bench model, for subsequent simulations.

13 Claims, 4 Drawing Sheets

(56) References Cited

U.S. PATENT DOCUMENTS

| | | | |
|---|---|---|---|
| 7,117,143 B2 | 10/2006 | Wang et al. | |
| 7,120,890 B2* | 10/2006 | Urata et al. | 716/108 |
| 7,181,376 B2 | 2/2007 | Fine et al. | |
| 7,302,417 B2* | 11/2007 | Iyer | 706/19 |
| 7,313,510 B2* | 12/2007 | Karunaratne | 703/14 |
| 7,315,972 B1 | 1/2008 | Bapat | |
| 7,502,966 B2* | 3/2009 | Buchonina et al. | 714/33 |
| 7,512,912 B1* | 3/2009 | Iyer | 716/136 |
| 7,539,968 B2 | 5/2009 | Charlebois et al. | |
| 7,546,500 B2 | 6/2009 | Kapur | |
| 7,644,398 B2* | 1/2010 | Cleaveland et al. | 717/135 |
| 7,856,607 B2 | 12/2010 | Grise | |
| 7,865,854 B2* | 1/2011 | Averill et al. | 716/106 |
| 7,984,353 B2* | 7/2011 | Furukawa et al. | 714/738 |
| 8,122,402 B2* | 2/2012 | Tanimoto | 716/107 |
| 8,161,440 B2* | 4/2012 | Emek et al. | 716/106 |
| 8,443,316 B1* | 5/2013 | Biswas et al. | 716/106 |
| 8,478,576 B1* | 7/2013 | Cameron | 703/14 |
| 2002/0040288 A1* | 4/2002 | Yamoto et al. | 703/17 |
| 2002/0184588 A1* | 12/2002 | Imark et al. | 714/741 |
| 2005/0010886 A1* | 1/2005 | Urata et al. | 716/6 |
| 2005/0278160 A1* | 12/2005 | Donnelly et al. | 703/19 |
| 2006/0075367 A1* | 4/2006 | Chan | 716/6 |
| 2007/0005533 A1* | 1/2007 | Iyer et al. | 706/19 |
| 2007/0276645 A1 | 11/2007 | Veller et al. | |
| 2007/0277130 A1* | 11/2007 | Lavelle | 716/4 |
| 2007/0288822 A1 | 12/2007 | Lin et al. | |
| 2008/0091402 A1* | 4/2008 | Karunaratne | 703/14 |
| 2008/0263489 A1 | 10/2008 | Canada | |
| 2008/0295043 A1* | 11/2008 | Chang et al. | 716/3 |
| 2009/0031268 A1 | 1/2009 | Miranda et al. | |
| 2009/0241074 A1* | 9/2009 | Tanimoto | 716/3 |
| 2009/0249272 A1 | 10/2009 | Yoda | |
| 2009/0271165 A1* | 10/2009 | Averill et al. | 703/13 |
| 2009/0313590 A1* | 12/2009 | Emek et al. | 716/5 |
| 2010/0031206 A1* | 2/2010 | Wu et al. | 716/2 |
| 2013/0117722 A1* | 5/2013 | Biswas et al. | 716/107 |

OTHER PUBLICATIONS

Nourani et al., "Application of Fuzzy Logic in Resistive Fault Modeling and Simulation;" IEEE Transactions on Fuzzy Systems, vol. 10, No. 4, Aug. 2002; pp. 461-472.

Office Action in U.S. Appl. No. 13/223,430 issued Aug. 30, 2012.

U.S. Appl. No. 13/223,430, filed Sep. 1, 2011.

* cited by examiner

AUTOMATED STIMULUS STEERING DURING SIMULATION OF AN INTEGRATED CIRCUIT DESIGN

BACKGROUND

1. Technical Field

This disclosure relates to integrated circuit (IC) design, and more particularly to automated functional coverage verification and of integrated circuit logic designs.

2. Description of the Related Art

During the IC design cycle, the design must be validated or verified to ensure that the design functions the way that it was intended to function. One way to verify the design is to perform some level of verification. Accordingly, verification includes providing some stimulus to the IC design, monitoring the results during simulation, and determining whether the stimulus exercised the IC design adequately to determine whether or not the design does function as it was designed to. Accordingly, the concept of coverage arises. Coverage refers to the concept of a verification engineer or other designer judging the stimulus applied to a system to verify the IC design.

There are several kinds of coverage available such as line, path, toggle, and finite state machine coverage, for example. In addition, exhaustive coverage which may test every possible state may be possible on small designs. However, as designs have increased in size and complexity, the number of possible states to cover can approach infinity. Thus, another coverage type may be more appropriate. Functional coverage is a more sophisticated type of coverage that usually involves having knowledge of the architecture of the design so that a relationship between signals can be defined and used to develop the desired coverage. Thus, of the nearly infinite number of states, the states that are the most interesting are selected. However, one drawback of obtaining adequate functional coverage is that the test selection process can be both time and resource intensive.

SUMMARY OF THE EMBODIMENTS

Various embodiments of a method for providing automated stimulus steering during simulation of an integrated circuit (IC) design are disclosed. Broadly speaking, a method is contemplated in which the stimulus to an IC design simulation may be automatically manipulated or steered so that the test environment is altered during subsequent simulations of the IC design based upon the simulation results and/or configuration settings of previous simulations of the IC design. More particularly, a stimulation steering tool may analyze the simulation results, and manipulate the test environment, which may include the test generator output, and the test bench model.

In one embodiment, the method includes simulating an IC design on a simulation test bench. The simulation test bench may generate a simulation stimulus for the IC design based on a test bench environment that includes independently controllable test bench parameters. The method may also include recording simulation results, and automatically manipulating the test bench environment to change the simulation stimulus during subsequent simulations of the IC design based upon the simulation results.

In one specific implementation, the method may also include manipulating configuration files associated with a test generator to adjust the test generator output to preferentially generate test patterns that sensitize selected logic within the IC design.

Figure 1:
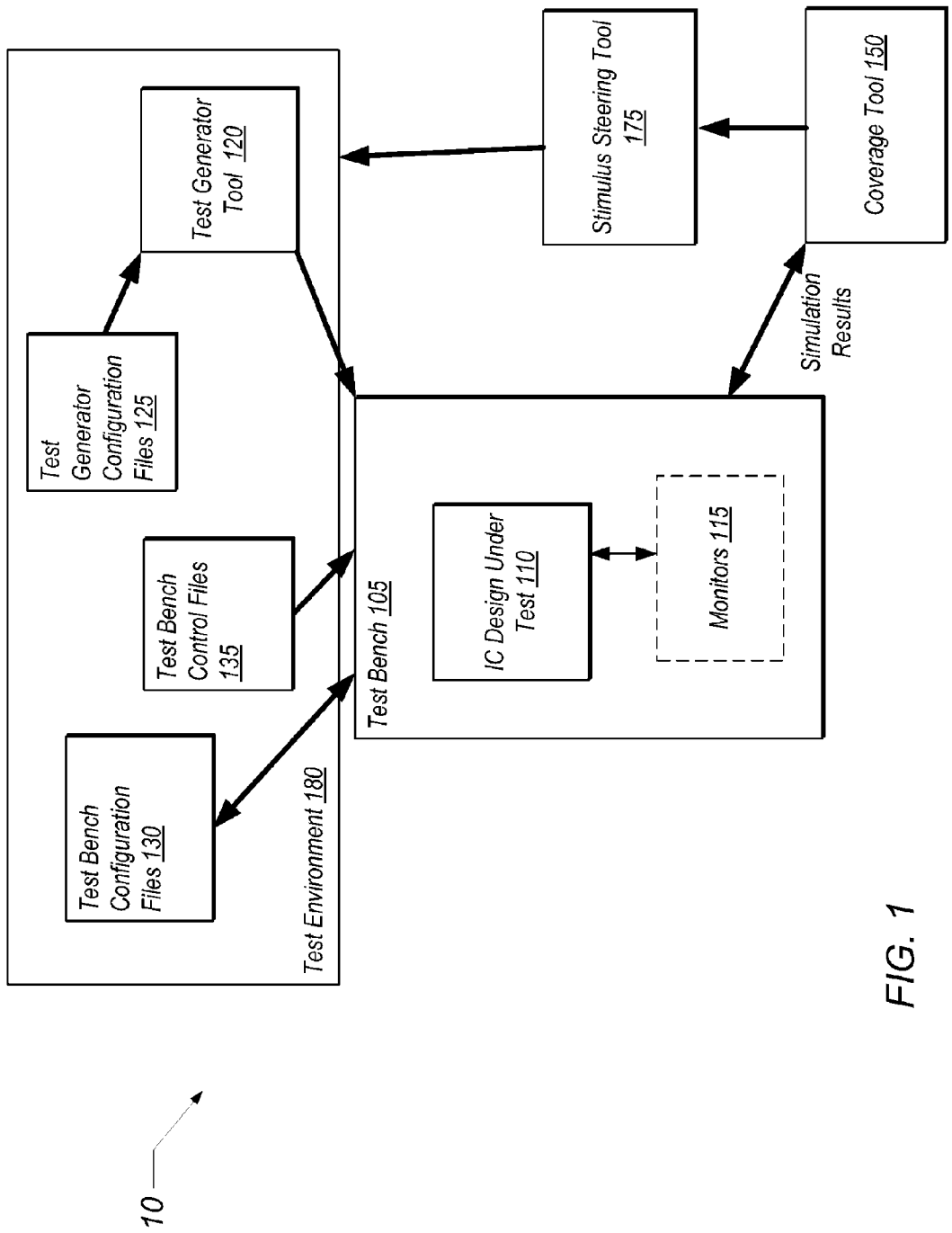
FIG. 1 is a conceptual diagram depicting one embodiment of a test environment for simulating an integrated circuit (IC) design.

Specific embodiments are shown by way of example in the drawings and will herein be described in detail. It should be understood, however, that the drawings and detailed description are not intended to limit the claims to the particular embodiments disclosed, even where only a single embodiment is described with respect to a particular feature. On the contrary, the intention is to cover all modifications, equivalents and alternatives that would be apparent to a person skilled in the art having the benefit of this disclosure. Examples of features provided in the disclosure are intended to be illustrative rather than restrictive unless stated otherwise.

As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six, interpretation for that unit/circuit/component.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

DETAILED DESCRIPTION

Turning now to FIG. 1, a conceptual diagram depicting one embodiment of a test environment for simulating an integrated circuit (IC) design is shown. The IC design under test 110 is simulated using a test bench 105. The test bench 105 may apply a simulation stimulus to the IC design under test 110. The simulation stimulus typically includes one or more test patterns that correspond to a test sequence or stream generated by the test generator 120. The test patterns may represent a predetermined group of signals and or instructions, for example. The test bench 105 may also monitor and record the results of the simulation using the monitors 115 and the coverage tool 150.

In various embodiments, the IC design under test 110 may be represented in a number of different ways. For example, the IC design may be represented as a register transfer level (RTL) representation, a gate-level netlist 235, and a transistor level netlist 240, among others. Accordingly, because the IC design under test 110 is typically instantiated into the test bench 105, dependent on what level the IC design under test 110 is represented, the test bench 105 that is used to simulate a given design may include different levels of logic depending on the level of hierarchy of the design within the context of the system. More particularly, if for example the IC design under test 110 is a processor, then test bench performs the functionality and provides the stimulus of the system in which the processor may reside. Likewise, if the IC design under test 110 were a functional unit within a processor, then the test bench 105 includes system logic and some of the logic of a processor, and the test bench 105 would now include functionality and stimulus of the system in which the processor resides, as well as the functionality and stimulus of the processor that interfaces to the functional unit.

As mentioned above, the test bench 105 may apply a stimulus to the design under test 110. To enable the test bench 105 to apply the appropriate stimulus, a test bench environment 180, which includes the test generator 120, may provide configuration and control information to the test bench 105. More particularly, in one embodiment the test environment 180 may include test bench configuration files 130 and test bench control files 135. The test generator 120 may also be provided with configuration information from test generator configuration files 125.

In one embodiment, the test bench configuration files 130 may specify, for example, which tests are to be run, and for how many cycles, while the test bench control files 135 may specify such configurations as specific memory models and latencies and bus master behaviors. In conjunction with the test generator patterns, there may be millions of possible test configurations that may be exercised. Each of the test patterns generated by the test generator 120, the test configurations provided by the test bench configuration files 130, and the system modes provided by the test bench control files 135 may be independently manipulated to alter or steer the test environment 180.

For example, the test generator tool 120 is configured to generate test patterns for use as simulation stimulus during simulation of the IC design under test 110. In one embodiment, the test generator tool 120 may be a directed random test generator (DRTG). The DRTG may produce pseudo random test patterns. However, the DTRG may be biased in various ways to produce test patterns that have a better chance of exercising specific functionality. More particularly, in one embodiment, the test generator configuration files 125 may be modified to steer the test generator 120 to produce more targeted test patterns. Accordingly, test generator tool 120 may have one or more adjustments available that may provide a level of test pattern steering or tuning. Similarly, the test bench configuration files 130 and/or the test bench control files 135 may be modified to alter the behavior of the test bench 105.

The test bench 105 may use monitors 115 or "event monitors" to identify and indicate whether specific events have occurred. More particularly, a monitor 115 may "look at" any nodes or signals that are visible in the IC design under test 110 and indicate whether or not a signal or set of signals matches conditions that have been set up in the monitor. Monitors 15 may be implemented in a variety of ways. In one embodiment, monitors 115 may be implemented in program instructions that are part of the test bench 105. In other embodiments, monitors 115 may be implemented as instructions that are called by the test bench 105 using, for example, an application programming interface (API) or the like.

The coverage tool 150 may gather simulation results from the test bench 105, including results from the monitors 115. As described in greater detail below, in one embodiment, these simulation results may be used by a stimulus steering tool 175 to automatically manipulate or steer the test environment 180 to apply a different and possibly more targeted stimulus to exercise the design under test 110.

Figure 2:
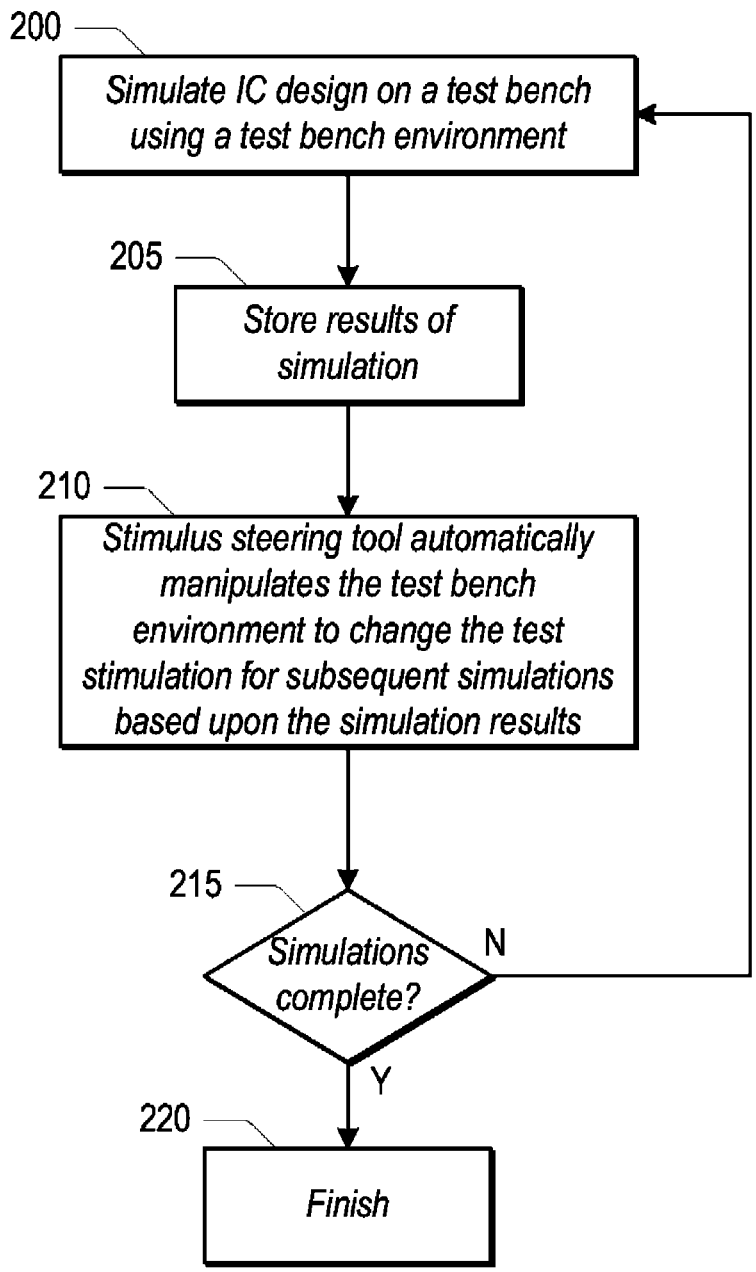
FIG. 2 is a flow diagram describing an embodiment of a method for automatically steering a stimulus provided by the test bench to an IC design during simulation.

Referring to FIG. 2, flow diagram describing an embodiment of a method for automatically steering a stimulus provided by the test bench to an IC design during simulation is shown. Referring collectively to FIG. 1 and FIG. 2 and beginning in block 200 of FIG. 2, in the IC design flow, once an IC design model has been established, and the test bench environment 180 has been configured for initial tests, the IC design under test 110 is then simulated on the test bench 105.

During simulation the results may be stored in a coverage tool database such as the coverage tool 150, for example (block 205). For example, which tests were run, whether there were failures, and where and when the failures occurred relative to the stimulus that produced the failures may be stored in the database of the coverage tool 150. In addition, some results may be stored within the test bench configuration files. For example, the number of cycles that were executed, what configuration was used for which tests, etc may be stored in the test bench configuration files.

In one embodiment, once a particular simulation run has completed, the stimulus steering tool 175 may manipulate the test bench environment 180 for subsequent simulations based upon the simulation results of the previous simulations (block 210). More particularly, as described in greater detail below in conjunction with the description of FIG. 3, the stimulus steering tool 175 may analyze the results and alter one or more test variables while possibly holding one or more other test variables the same during additional simulation runs. For example, if the steering tool 175 determines that a particular circuit is tested beyond some threshold number of times, while another circuit has not been tested to a minimum threshold, the steering tool 175 may manipulate the test environment 180 in an effort to test the overly tested circuit less, and to test the under-tested circuit more. If the simulations are complete (block 215), then the simulation process is finished (block 220). However, if the simulations are not complete, additional simulations may be performed as described in block 200. More particularly, in one embodiment, this may be an iterative process of changing one or more test environment variables and running additional simulations until the desired test coverage has been met, or until some timeframe has been met or been exceeded as desired. It is noted that the stimulus steering tool 175 may automatically, and without user intervention, manipulate the test environment 180.

Figure 3:
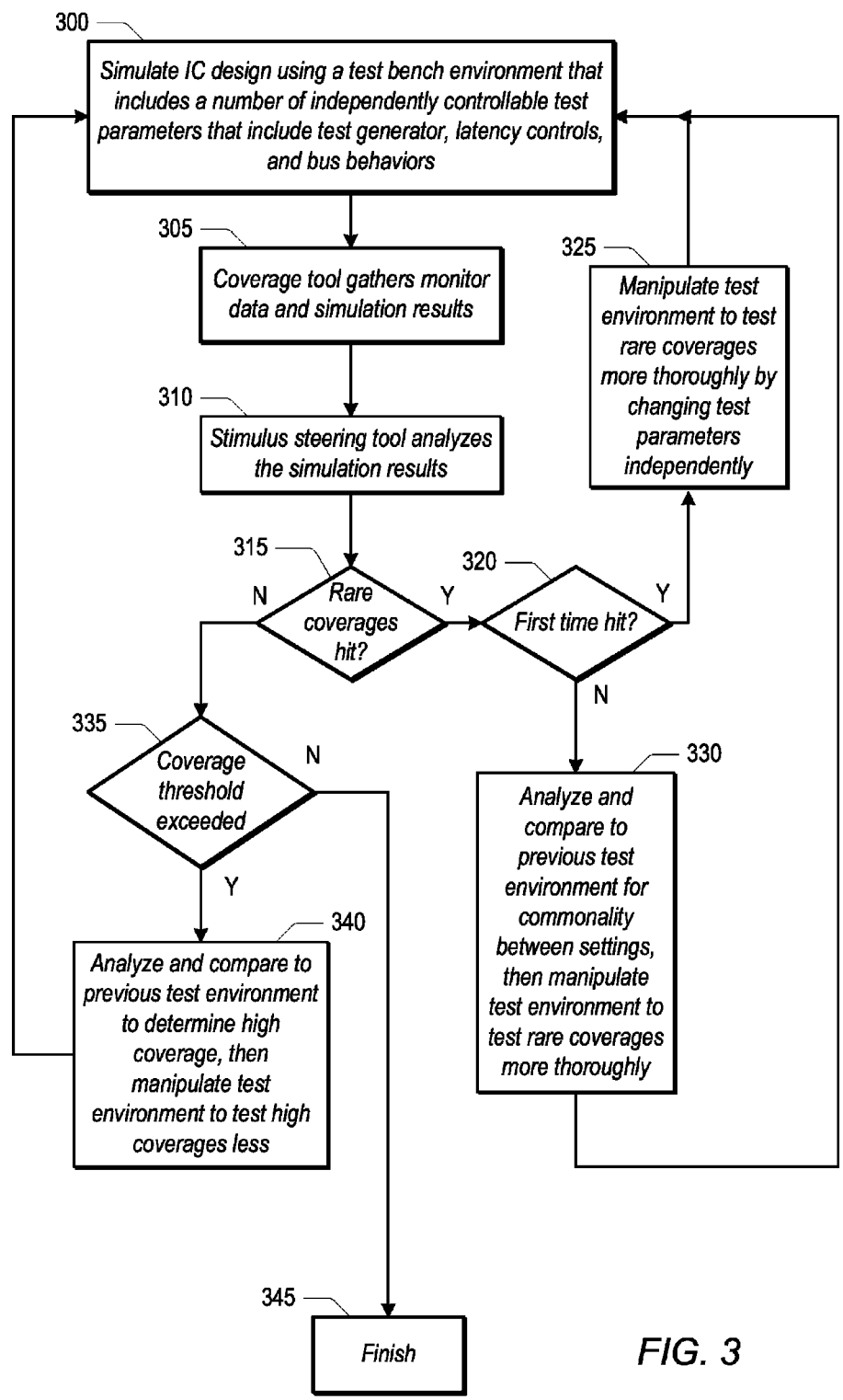
FIG. 3 is a flow diagram describing another embodiment of a method for automatically steering a stimulus provided by the test bench to an IC design during simulation.

In FIG. 3, a flow diagram describing another embodiment of a method for automatically steering a stimulus provided by the test bench to an IC design during simulation is shown. Referring collectively to FIG. 1 and FIG. 3, and beginning in block 300 of FIG. 3, the IC design under test 110 is simulated on the test bench 105 using the test environment 180 that has been set up. For example, the test environment 180 may include a number of independently controllable test parameters such as the test patterns produced by the test generator tool 120, the test bench configuration files 130, and the test bench control files 135, for example.

During simulation of the IC design under test 110, the coverage tool 150 may gather the monitor and simulation results (block 305). In one embodiment, the stimulus steering tool 175 analyzes the simulation results in the coverage tool 150, as well as information in the test bench configuration files 130 (block 310). The stimulus steering tool may determine if any particularly rare coverage areas have been tested or hit. If no rare coverage points have been hit, the stimulus steering tool 175 may then determine whether or not any test coverage thresholds have been exceeded (block 335). More particularly, in certain cases, the test bench configuration files 130 may specify a limit or threshold value for the number of times a particular test is to be run, or how many times a particular node or circuit is exercised, either in the abstract or relative to some other circuit or node, for example. If a threshold has not been exceeded (block 335), the simulation may be complete (block 345). However, if the threshold has been exceeded, in one embodiment the stimulus steering tool 175 may determine the cause of the exceeded coverage using previous test environment configuration settings. The stimulus steering tool 175 manipulates the test environment 180 in an effort to reduce testing the circuits and/ or nodes with the exceeded thresholds in future simulation runs (block 240).

Referring back to block 315, if rare coverage points have been hit, the stimulus steering tool 175 may determine whether or not this is the first time that it has been hit based upon previous simulation results, for example. If it is the first time, the stimulus steering tool 175 may manipulate the test environment 180 by systematically manipulating one independent test variable at a time and re-simulating to test the coverage point more thoroughly in subsequent simulation runs (block 325). If, however, it is not the first time the rare coverage has been hit (clock 320), the stimulus steering tool 175 may analyze and compare the test environment configuration that was most recently used to previous test environment configurations to determine if there is any commonality between configuration settings. Based upon the analysis, the stimulus steering tool 175 may manipulate the test environment 180 to test rare coverage points more thoroughly in subsequent simulations (block 330).

Figure 4:
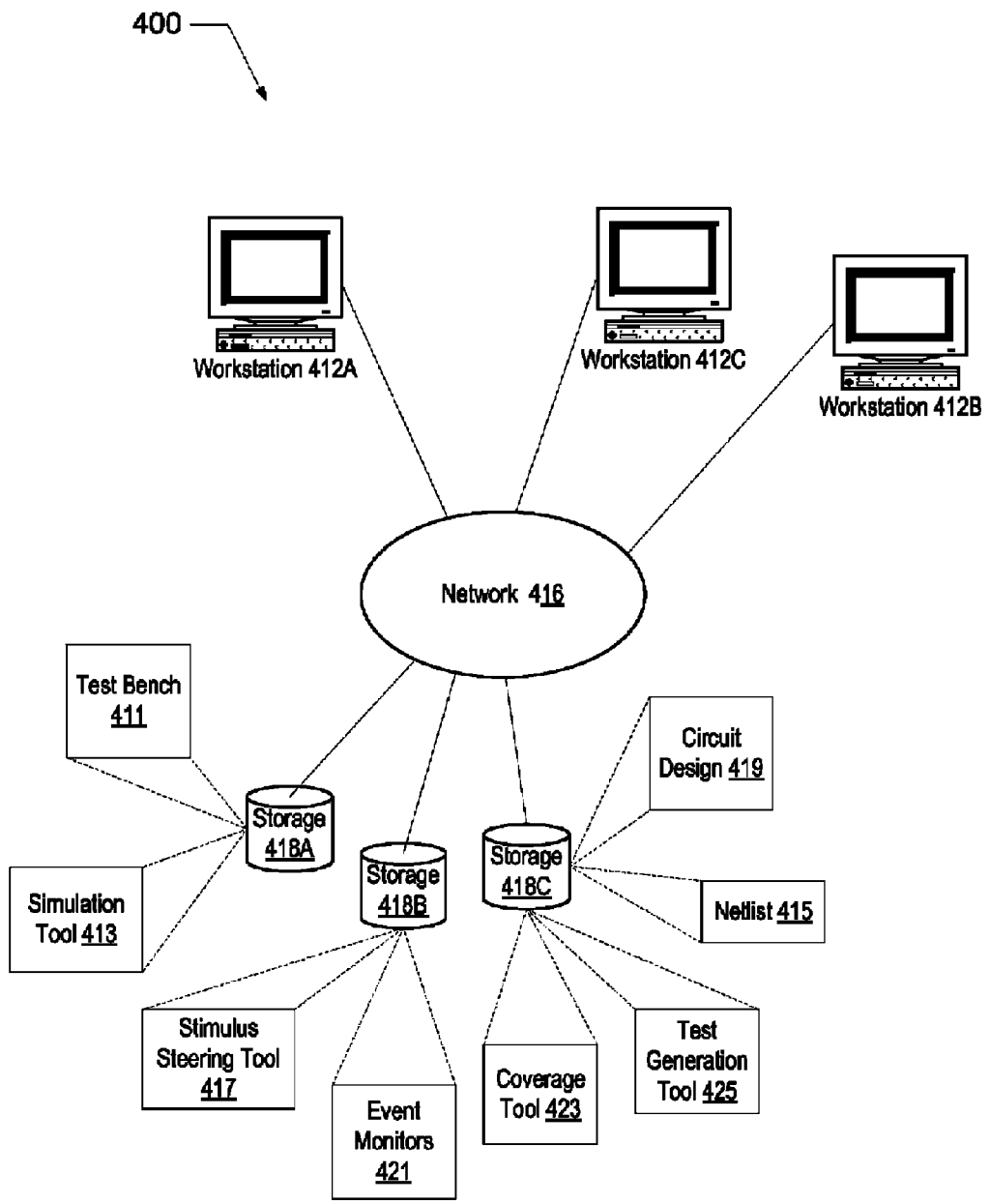
FIG. 4 is a block diagram of one embodiment of a system for implementing a tool for automatically steering the stimulus of a test environment during simulation of an IC design.

Turning to FIG. 4, a block diagram of one embodiment of a system for implementing a tool for automatically steering the stimulus of the test environment during simulation of an IC design is shown. Computer system 400 includes a plurality of workstations designated 412A through 412C. The workstations are coupled together through a network 416 and to a plurality of storages designated 418A through 418C. In one embodiment, each of workstations 412A-412C may be representative of any standalone computing platform that may include, for example, one or more processors, local system memory including any type of random access memory (RAM) device, monitor, input output (I/O) means such as a network connection, mouse, keyboard, monitor, and the like (many of which are not shown for simplicity).

In one embodiment, storages 418A-418C may be representative of any type of non-transitory computer-readable storage device such as hard disk systems, optical media drives, tape drives, ram disk storage, and the like. As such, the program instructions comprising the design tools may be stored within any of storages 418A-418C and loaded into the local system memory of any of the workstations during execution. As an example, as shown in FIG. 4, the test bench tool 411 and the simulation tool 413 are shown stored within storage 418A, while the netlist(s) 415, circuit design (e.g., behavioral, RTL, etc) 719, test generation tool 725, and the coverage tool 423 are stored within storage 418C. Further, the stimulus steering tool 417, and the event monitors 421 are stored within storage 418B. Additionally, the program instructions may be stored on a portable/removable storage media. The program instructions may be executed directly from the removable media or transferred to the local system memory of a given workstation 412 or mass storages 418 for subsequent execution. As such, the portable storage media, the local system memory, and the mass storages may be referred to as non-transitory computer-readable storage mediums. The program instructions may be executed by the one or more processors on a given workstation or they may be executed in a distributed fashion among the workstations, as desired.

In one embodiment, the stimulus steering tool 417 may include program instructions written in any of a variety of programming languages or scripting languages, and which may be executable by a processor to automatically manipulate the test environment to steer the stimulus provided by the test bench 411 to the IC design being simulated.

It is noted that although the computer system shown in FIG. 4 is a networked computer system, it is contemplated that in other embodiments, each workstation may also include local mass storage. In such embodiments, the program instructions and the results of the design tools may be stored locally. Further, it is contemplated that the program instructions may be executed on a standalone computer such as a personal computer that may include local mass storage and a system memory.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A method comprising:
simulating, using a computer, an integrated circuit (IC) design on a simulation test bench, wherein the simulation test bench generates a simulation stimulus for the IC design based on a test bench environment that includes a plurality of independently controllable test bench parameters;
recording simulation results;
analyzing the simulation results; and
automatically manipulating the test bench environment, using the computer, to change the simulation stimulus during subsequent simulations of the IC design to reduce test coverage of a particular portion of the IC design in response to determining that a maximum test coverage threshold value for the particular portion of the IC design has been exceeded.

2. The method as recited in claim 1, further comprising automatically manipulating the test bench environment, using the computer, to change the simulation stimulus during subsequent simulations of the IC design to increase test coverage of a different portion of the IC design in response to determining that the maximum test coverage threshold value for the particular portion of the IC design has been exceeded.

3. The method as recited in claim 1, further comprising comparing a most recent test environment to the test environment from one or more previous simulations of the IC design to determine which of the plurality of independently controllable test bench parameters to manipulate.

4. The method as recited in claim 1, further comprising automatically manipulating, using the computer, each of the plurality of independently controllable test bench parameters one at a time and performing a subsequent respective simulation in response to determining that a minimum test coverage threshold value of the particular portion of the IC design has not been reached.

5. The method as recited in claim 1, wherein the plurality of independently controllable test bench parameters includes stimulus information provided by a test generator.

6. The method as recited in claim 5, further comprising manipulating one or more configuration files associated with the test generator for manipulating the test bench environment.

7. The method as recited in claim 6, wherein manipulating the one or more configuration files associated with the test generator corresponds to adjusting an output of the test generator to preferentially generate test patterns that sensitize selected logic within the IC design.

8. The method as recited in claim 1, wherein the plurality of independently controllable test bench parameters includes stimulus information provided by one or more test bench configuration files.

9. The method as recited in claim 8, further comprising manipulating the test bench configuration files to manipulate the test bench environment.

10. The method as recited in claim 1, wherein the plurality of independently controllable test bench parameters includes test environment control and configuration information received by the test bench.

11. The method as recited in claim 10, further comprising manipulating the test environment control and configuration information to manipulate the test bench environment.

12. A method comprising:
   simulating, using a computer, an integrated circuit (IC) design on a simulation test bench, wherein the simulation test bench generates a simulation stimulus for the IC design based on a test bench environment that includes a plurality of independently controllable test bench parameters;
   recording simulation results using the computer;
   analyzing the simulation results using the computer; and
   automatically manipulating, using the computer, each of the plurality of independently controllable test bench parameters one at a time and performing a subsequent respective simulation in response to determining that a particular test coverage parameter has been tested a first time.

13. The method as recited in claim 12, further comprising in response to determining that a minimum test coverage threshold value of the particular test coverage parameter has not been reached but is greater than one, comparing a most recent test environment to the test environment from one or more previous simulations of the IC design to determine in what order to manipulate the plurality of independently controllable test bench parameters during subsequent simulations of the IC design until the minimum test coverage threshold value has been reached.

* * * * *